United States Patent
Fujii

(10) Patent No.: US 7,439,754 B2
(45) Date of Patent: Oct. 21, 2008

(54) SEMICONDUCTOR INTEGRATED CIRCUIT AND DEVICE AND METHOD FOR TESTING THE CIRCUIT

(75) Inventor: Kuninobu Fujii, Kanagawa (JP)

(73) Assignee: NEC Eletronics Corporation, Kanagawa (JP)

( * ) Notice: Subject to any disclaimer, the term of this patent is extended or adjusted under 35 U.S.C. 154(b) by 327 days.

(21) Appl. No.: 11/444,348

(22) Filed: Jun. 1, 2006

(65) Prior Publication Data

US 2006/0284293 A1    Dec. 21, 2006

(30) Foreign Application Priority Data

Jun. 2, 2005    (JP) ............................. 2005-163006

(51) Int. Cl.
  *G01R 31/26* (2006.01)
(52) U.S. Cl. ..................................... 324/765
(58) Field of Classification Search .................. 324/705, 324/770, 158.1, 754, 76.11, 763; 326/16; 714/724; 702/117, 108, 124; 257/48, 678, 257/211
See application file for complete search history.

(56) References Cited

U.S. PATENT DOCUMENTS 7,212,027 B2 * 5/2007 Ishibashi et al. ............... 326/14
7,298,656 B2 * 11/2007 Minzoni ...................... 365/194

FOREIGN PATENT DOCUMENTS

JP    7-58172    3/1995
JP    2002-314394    10/2002

\* cited by examiner

*Primary Examiner*—Ha Nguyen
*Assistant Examiner*—Trung Q Nguyen
(74) *Attorney, Agent, or Firm*—Young & Thompson

(57) ABSTRACT

An accelerated test for transistors included in inverter circuits of a semiconductor integrated circuit is to be improved in efficiency. Output terminals 30A, 30B of inverter circuits 11, 12, each including a CMOS circuit, may be short-circuited. A test circuit 20 supplies signals of mutually exclusive logical values to the inverter circuits 11, 12, whose output terminals 30A, 30B are in a short-circuited state. For testing, a switch 50 is turned on to short-circuit the output terminal 30A, 30B and signals of opposite logical levels are alternately supplied to the inverter circuits 11, 12 to cause the current to flow alternately through N-channel MOS transistors and P-channel MOS transistors included in the two CMOS circuits to activate the circuits.

9 Claims, 7 Drawing Sheets

US 7,439,754 B2

SEMICONDUCTOR INTEGRATED CIRCUIT AND DEVICE AND METHOD FOR TESTING THE CIRCUIT

FIELD OF THE INVENTION

This invention relates to a semiconductor integrated circuit, and a test device and a test method therefor. More particularly, this invention relates to a semiconductor integrated circuit in which an inverter circuit is connected to each of a plural number of output terminals, and a device and a method for testing the circuit.

BACKGROUND OF THE INVENTION

By and large, a so-called output buffer is provided at an output part of a semiconductor integrated circuit, such as a microcomputer or a system LSI, as an interface for an externally provided device. An inverter circuit is used as this output buffer. For example, a CMOS (Complementary MOS) inverter, made up by the combination of a P-channel MOS (Metal Oxide Semiconductor) transistor and an N-channel MOS transistor, has so far been known and used. The JP Patent Kokai Publication No. JP-P2002-314394A, for example, discloses a CMOS based output buffer capable of controlling the bufferability of the output buffer.

In the manufacture process for a semiconductor integrated circuit, a variety of accelerated tests are conducted for eliminating infant defects and for stabilizing the performance. In the gazette of JP Patent Kokai Publication No. JP-A-7-58172, there is introduced a universal burn-in board for conducting a burn-in test for a packaged semiconductor integrated circuit, in which a sub-board, provided with short-circuiting wiring, is mounted on the burn-in board to override the operation of a plural number of pull-up resistors connected to a lead terminal. The universal burn-in board, shown in the above gazette, is provided with a large number of pull-up resistors for pull-up of the input and output terminals for protecting the device.

[Patent Document 1]
JP Patent Kokai Publication No. JP-P2002-314394A
[Patent Document 2]
JP Patent Kokai Publication No. JP-A-7-58172

SUMMARY OF THE DISCLOSURE

However, in case a tester for pull-up or pull-down connection of the input and output terminals to internally supply the current to the inverter circuit to carry out an operation test and an accelerated test, there is presented a problem that the transistors provided in the inverter circuit cannot be activated efficiently.

FIG. 6 shows the configuration of the vicinity of an output terminal of a semiconductor integrated circuit as mounted on the universal burn-in board disclosed in the aforementioned Patent Document 2. Referring to FIG. 6, a pair of inverter circuits 11, 12, provided at the trailing stage of the output buffer, are designed for logically inverting the levels of input signals S1, S2 to output the resulting inverted logical levels of the input signals S1 and S2 to terminals 30A and 30B, respectively. The terminals 30A, 30B are each connected to a power source (power supply units) via a pull-up resistor 42.

FIGS. 7A and 7B show the operation for testing for a case where a terminal having an inverter circuit 11 or 12 formed by a CMOS circuit is connected in a pull-up or pull-down fashion in order to carry out testing. Initially, the case of pull-up connection, shown in FIG. 7A, is taken as an example for illustration. In case a signal S1 is HIGH, an N-channel MOS transistor 11n of the inverter circuit 11 is turned on, while a P-channel MOS transistor 11p is turned off. At this time, a path 61H for the current established from the power source (power supply unit) to a pull-up resistor 42 and thence to the N-channel MOS transistor 11n, so that the current flows through and activates the N-channel MOS transistor 11n, If conversely the signal S1 is LOW, the N-channel MOS transistor 11n of the inverter circuit 11 is turned off, while the P-channel MOS transistor 11p is turned on. At this time, the power source and the output of the terminal 30A are at the same potential, and hence no current can be supplied to the P-channel MOS transistor 11p.

The same may be said of FIG. 7B in which the terminal is connected in the pull-down fashion. When the signal S2 is at a low logical level, a P-channel MOS transistor 12p of an inverter circuit 12 is turned on, while an N-channel MOS transistor 11n is turned off. At this time, a path 62L for the current is established from the power supply unit to the P-channel MOS transistor 12p and thence to the pull-up resistor 43, so that the current flows through and activates the P-channel MOS transistor 12p. If conversely the signal S2 is HIGH, the P-channel MOS transistor 12p of the inverter circuit 12 is turned off, while the N-channel MOS transistor 12n is turned on, the power source and the terminal 30B assume the same potential so that a path 62H is not established and hence no current can be supplied to the current N-channel MOS transistor 12n.

In one aspect, the present invention provides a semiconductor integrated circuit including a plurality of inverter circuits connected to a plurality of output terminals, respectively, and a test circuit. Preset ones of the output terminals, forming a set of output terminals, are so structured as to be short-circuitable. The semiconductor integrated circuit comprises a test circuit that supplies signals of mutually exclusive logical values to a set of the inverter circuits, when output sides of the inverter circuits are in a short-circuited state. In such test circuit or semiconductor integrated circuit, the terminals, connected to the inverter circuits under test, are short-circuited, during the test, and signals of opposite logical levels are alternately supplied to the set of the inverter circuits in the short-circuited state. In this manner, the current may be supplied alternately to a set of transistors contained in each of the plural inverter circuits for efficient activation of the respective transistors.

In a second aspect, the present invention provides a test device for a semiconductor integrated circuit including a plurality of output terminals connected to a plurality of inverter circuits, respectively, and a test circuit for the inverter circuits for supplying signals of mutually exclusive logical values to preset ones of the inverter circuits. The test device comprises a short-circuiting circuit for short-circuiting preset ones of the output terminals connected to preset ones of the inverter circuits, and a test signal output terminal supplying a test signal to the test circuit for causing the test circuit to supplying signals of mutually exclusive logical values to the inverter circuits whose output sides are in a short-circuited state. The signals of mutually opposite logical levels are alternately supplied to a set or sets of the inverter circuits of the semiconductor integrated circuit to effect activating operations similar to those for the test circuit and the semiconductor integrated circuit.

In a third aspect, the present invention provides a test method for the above-described semiconductor integrated circuit. The method comprises a step of short-circuiting preset ones of output terminals connected to preset ones of the inverter circuits, respectively, and a step of supplying a test signal to the test circuit for causing the test circuit to supply signals of mutually exclusive logical values to whose inverter circuits the output sides are in a short-circuited state. The logical values of input signals to the preset inverter circuits, whose output sides are in the short-circuited state, are periodically interchanged to alternately drive the preset inverter circuits.

The meritorious effects of the present invention are summarized as follows.

According to the present invention, the transistors contained in the inverter circuits may be activated efficiently within a limited time period, so that infant (initial) defective products may be detected within a short time period.

PREFERRED EMBODIMENTS OF THE INVENTION

Figure 1:
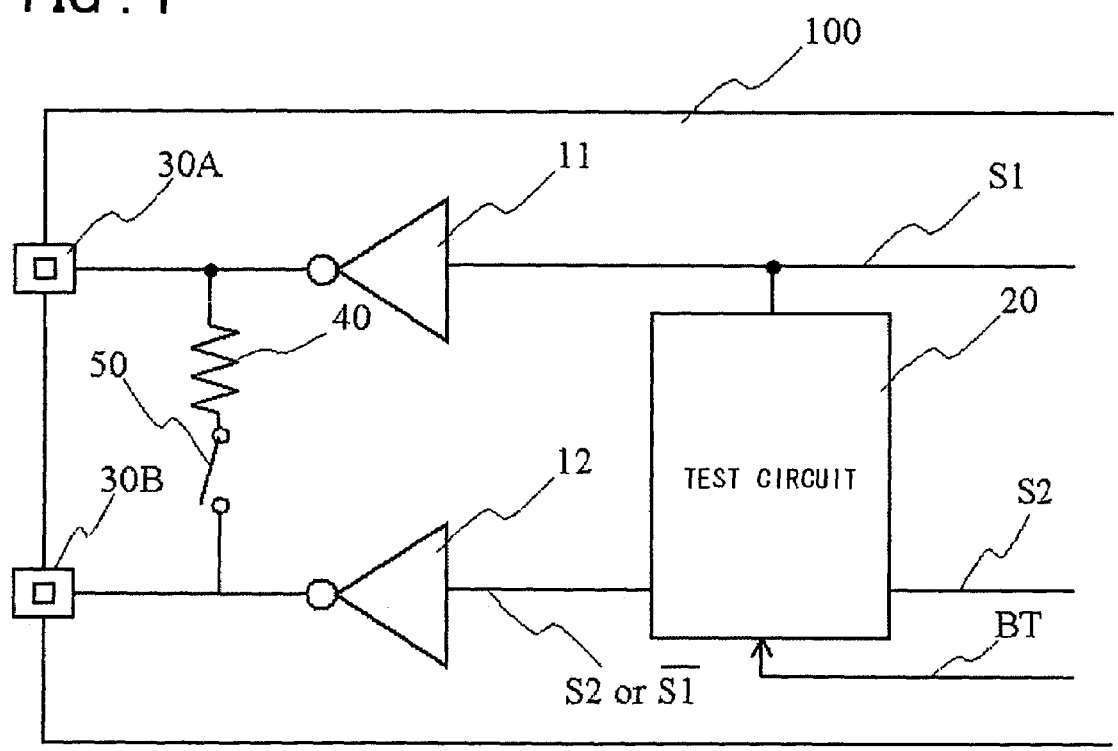
FIG. 1 is a block diagram showing a configuration of a semiconductor integrated circuit according to a first embodiment of the present invention.

The preferred embodiments for carrying out the present invention will now be described. FIG. 1 depicts a block diagram showing the configuration of a semiconductor integrated circuit according to a first embodiment of the present invention. Referring to FIG. 1, a semiconductor integrated circuit 100 is made up by inverter circuits 11 and 12, making up an output buffer, a test circuit 20, terminals 30A and 30B, associated with the inverter circuits 11 and 12, respectively, a resistor 40 and a switch 50 for connecting/disconnecting a pair of inverted output terminals of the inverter circuits 11 and 12.

Figure 2:
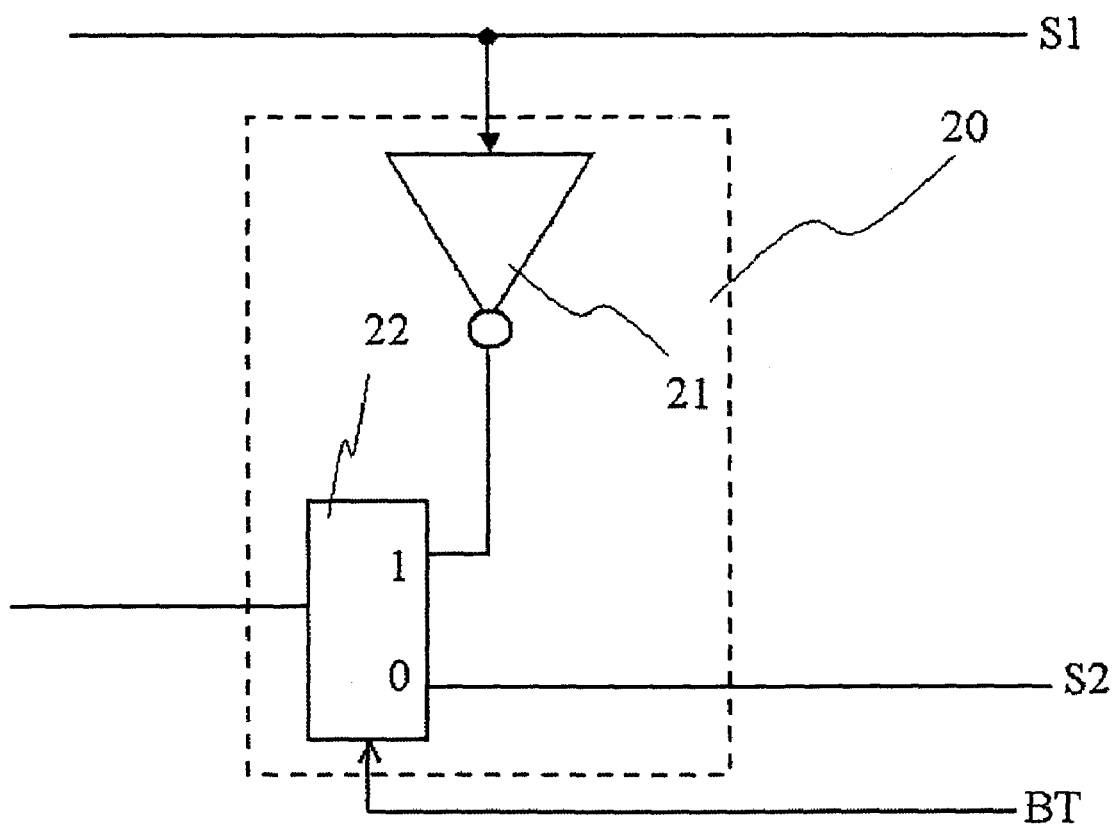
FIG. 2 is a circuit diagram showing a detailed configuration of the semiconductor integrated circuit according to the first embodiment of the present invention.

The test circuit 20 is made up by, for example, an inverter circuit 21 and a selecting circuit 22, as shown in FIG. 2. During the normal operation, the test circuit outputs a signal S2 to the inverter circuit 12. During the test mode operation, when a test mode signal BT is entered at a preset logical level '1', the signal S1 is inverted and output to the inverter circuit 12. Thus, during testing, the inverter circuits 11 and 12 are supplied with signals having mutually exclusive logical values. In case the logical level of the signal S1 is inverted, that of the signal entered to the inverter circuit 12 is also inverted.

A switch 50 is switching means, formed by e.g. a transistor. The switch is turned on during testing to provide for short-circuiting of the outputs of the inverter circuits 11 and 12.

Figure 3:
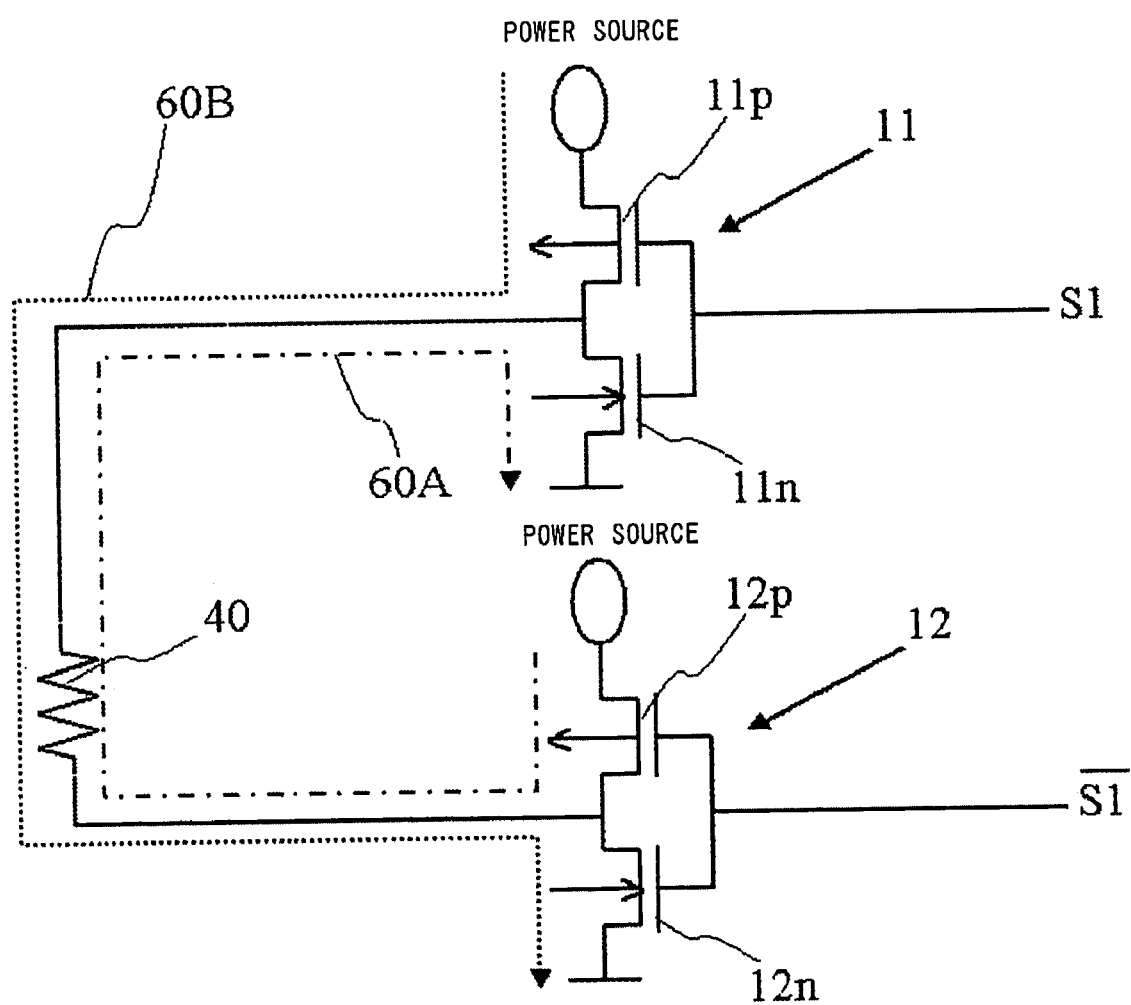
FIG. 3 is a diagram for illustrating the operation at the time of testing of the semiconductor integrated circuit according to the first embodiment of the present invention.

The operation of the present embodiment will now be described. FIG. 3 shows the operation for testing an output buffer of a semiconductor integrated circuit of the present embodiment. Referring to FIG. 3, the inverter circuits 11 and 12, making up an output buffer, are formed by a set of a P-channel MOS transistor 11p and an N-channel MOS transistor 11n and by a set of a P-channel MOS transistor 12p and an N-channel MOS transistor 12n, respectively. Both the gates of N-channel and P-channel transistors 11n and 11p are connected in common to a signal line S1. The drains of these transistors 11n and 11p are connected in common to the short circuiting switch via resistor 40, which is further connected to the common drains of the transistors 12n and 12p. The common sources of the transistors 12n and 12p are connected to a signal line of S1 Bar.

During testing, a signal S1 and a signal S1 Bar, which is a signal corresponding to the signal S1 inverted in logical level, are output, by the aforementioned test circuit, to the inverter circuits 11 and 12 making up the output buffer.

For example, if the signal S1 is entered in a HIGH logical level, the P-channel MOS transistor 11p and the N-channel MOS transistor 11n of the inverter circuit 11 are turned off and on, respectively, whilst the P-channel MOS transistor 12p and the N-channel MOS transistor 12n are turned on and off, respectively. If, in this state, the output ends of the inverter circuits 11 and 12 are short-circuited, via resistor 40, there is formed a path 60A for the current flowing through the P-channel MOS transistor 12p of the inverter circuit 12, resistor 40 and through the N-channel MOS transistor 1n of the inverter circuit 11. This activates the set of the MOS transistors which are in the on-state.

If the signal S1 is then changed over to a LOW logical level, the P-channel MOS transistor 11p and the N-channel MOS transistor 11n of the inverter circuit 11 are turned off and on, respectively, while the P-channel MOS transistor 12p and the N-channel MOS transistor 12n of the inverter circuit 12 are turned off and on, respectively. If, in this state, the output ends of the inverter circuits 11 and 12 are short-circuited, via resistor 40, there is formed a path 60B for the current flowing through the P-channel MOS transistor 11p of the inverter circuit 11, resistor 40 and through the N-channel MOS transistor 12n of the inverter circuit 12. This activates the set of the MOS transistors which are in the on-state.

Accordingly, if an output buffer under testing is formed by a set or a pair of inverter circuits, and signals opposite in the logical level are supplied to the inverter circuits, all MOS transistors of the output buffer may be activated by one cycle of the test signal. The configuration, described above, may be applied with advantage to the accelerated test in the course of manufacture of a semiconductor integrated circuit.

Figure 4:
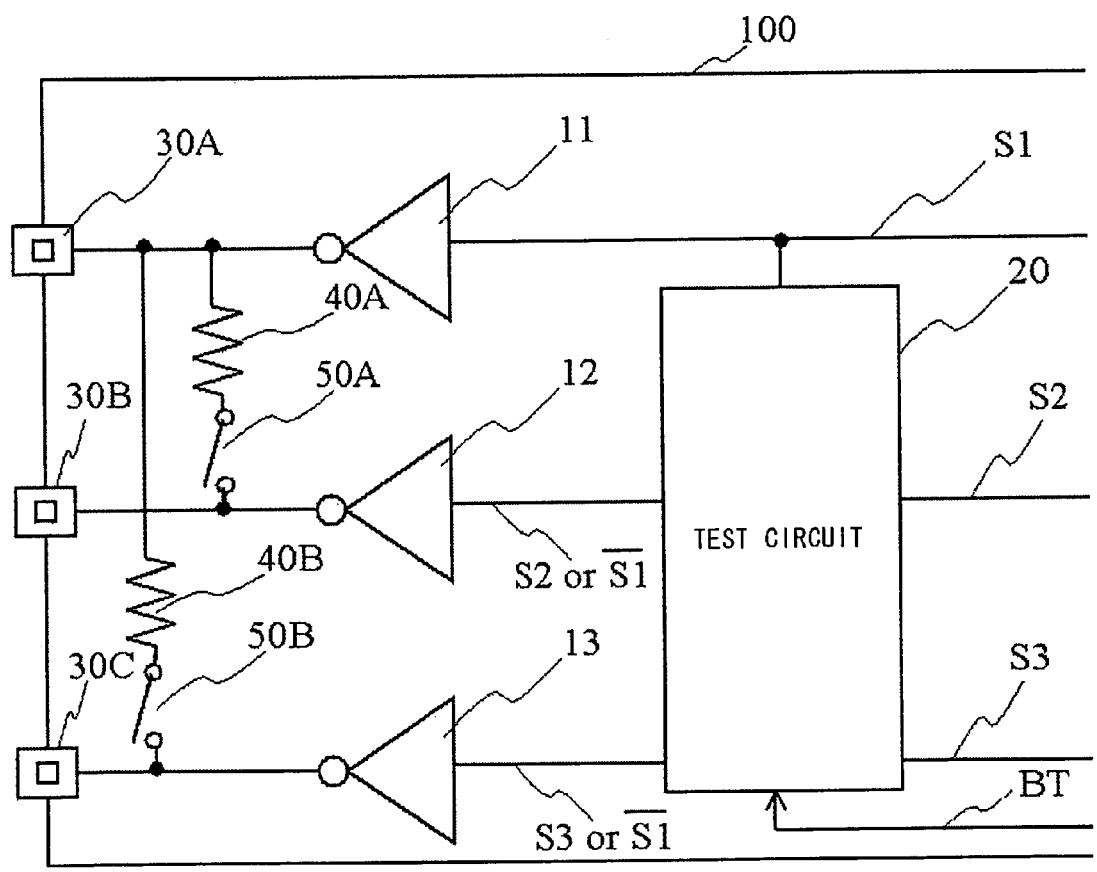
FIG. 4 is a block diagram showing the configuration of a semiconductor integrated circuit according to a second embodiment of the present invention.

A second embodiment of the present invention, which is a modification of the above-described first embodiment, will now be described. FIG. 4 is a block diagram for illustrating the configuration of a semiconductor integrated circuit of the second embodiment of the present invention. Referring to FIG. 4, a semiconductor integrated circuit 100 is made up by inverter circuits 11, 12 and 13, a test circuit 20, terminals 30A, 30B and 30C, associated with the inverter circuits 11, 12 and 13, respectively, a pair of resistors 40A and 40B, and a pair of switches 50A and 50B. The switch 50A serves to short-cut, via the resistor 40A, the output terminals of a pair of inverters 11 and 12, whereas the switch 50B serves to short-cut, via the resistor 40B the output terminals of another pair of inverters 11 and 13. Here the inverter 11 acts as a basic inverter for the short-cut pairing.

A test circuit 20 of the present embodiment is similar to the corresponding circuit of the first embodiment described above. That is, signals different in the logical level may be entered to each set (pair) of inverter circuits that may be short-circuited via resistor 40A or 40B. For example, if a signal HIGH is supplied to the inverter circuit 11 during testing, a LOW signal, which is an inversion of the signal S1, is supplied to the inverter circuits 12 and 13. In a similar manner, if a LOW signal S1 is supplied to the inverter circuit 11, a HIGH signal, which is an inversion of the signal S1, is entered to the inverter circuits 12 and 13.

Thus, by changing over the switches 50A, 50B at a proper timing, all of MOS transistors, included in three or more inverter circuits, may be activated in one on/off cycle of the signal S1.

Figure 5:
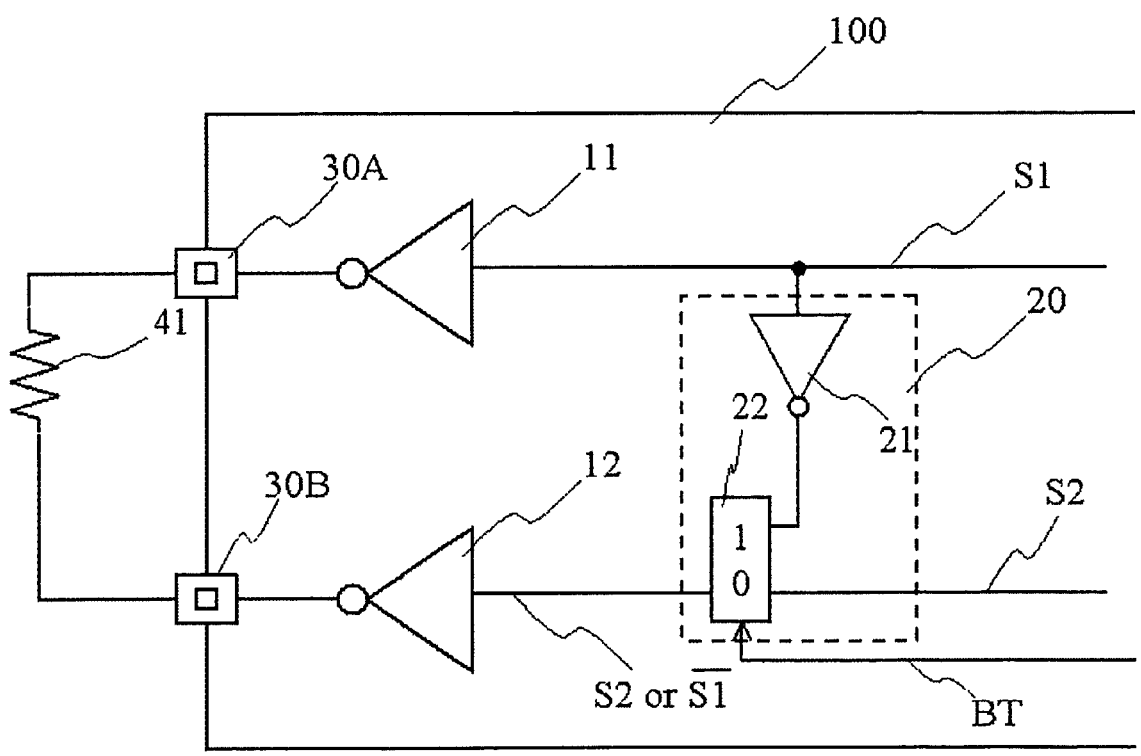
FIG. 5 is a block diagram showing the configuration of a semiconductor integrated circuit according to a third embodiment of the present invention.
Figure 6:
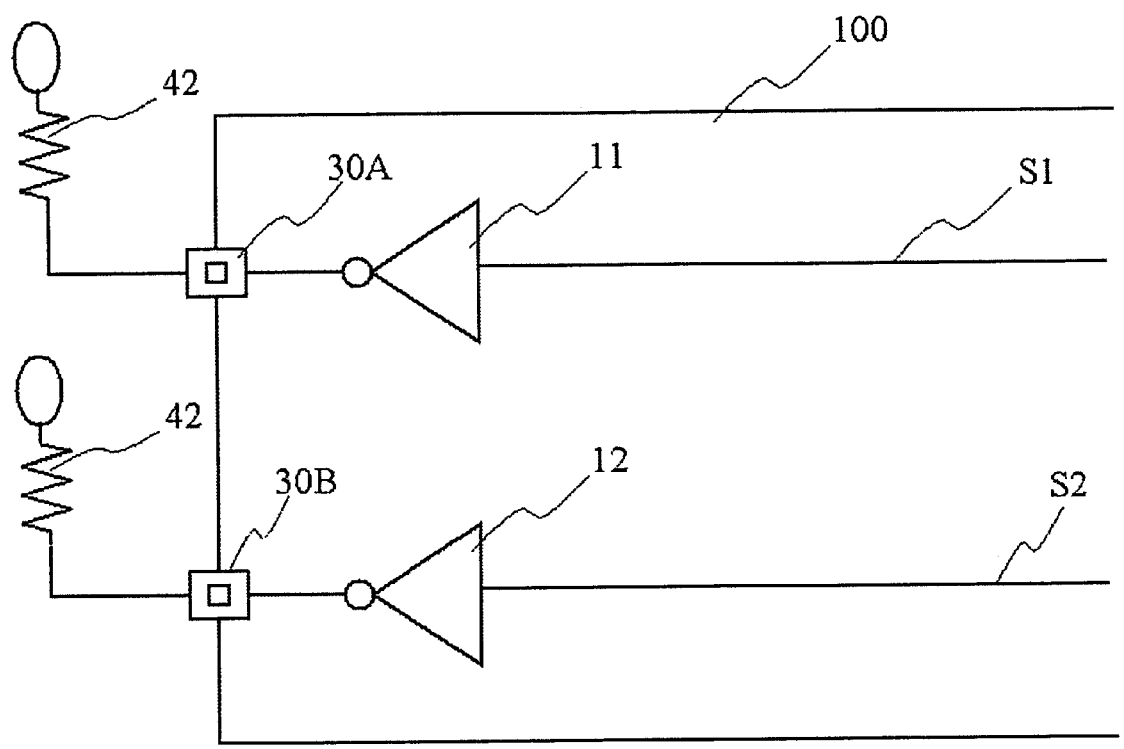
FIG. 6 is a block diagram showing the configuration of a conventional semiconductor integrated circuit and a conventional test device.
Figure 7A:
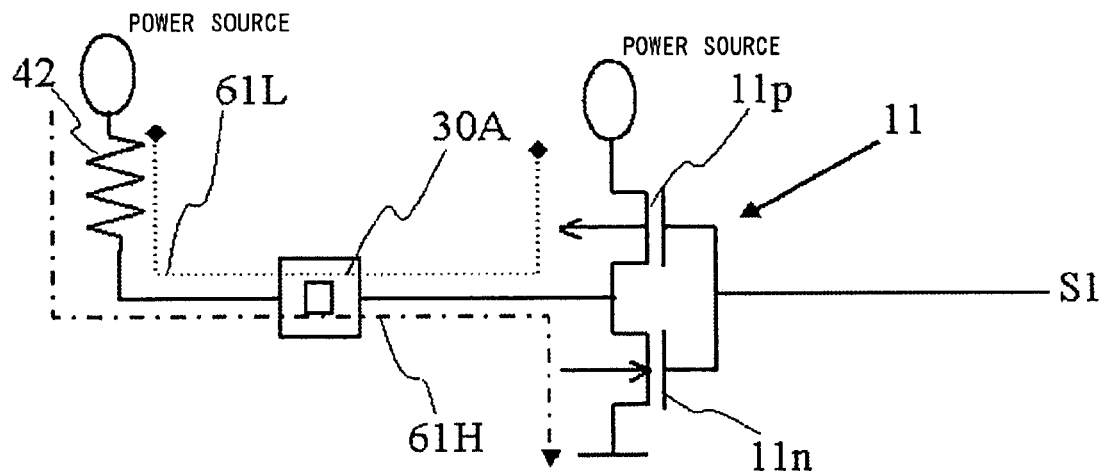
FIGS. 7A and 7B are diagrams for illustrating the operation for testing with a conventional configuration with pull-up or pull-down connection.
Figure 7B:
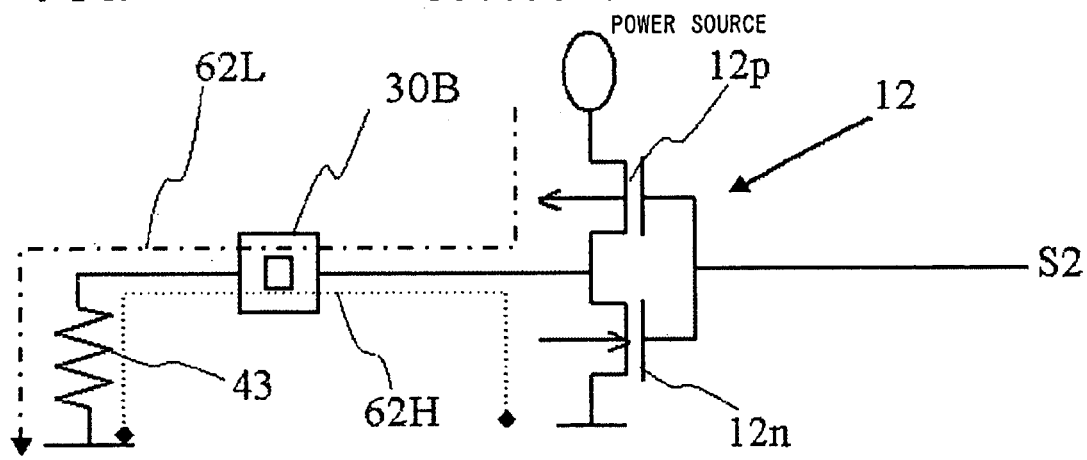

A third embodiment of the present invention, in which a resistor of a semiconductor integrated circuit in each of the above-described embodiments is provided on a test device side, will now be described. FIG. 5 depicts a block diagram showing the configuration of a semiconductor integrated circuit and a burn-in device (test device) according to the third embodiment of the present invention. Referring to FIG. 5, a semiconductor integrated circuit 100 is made up by inverter circuits 11 and 12, making up an output buffer, a test circuit 20, and terminals 30A, 30B, output (inverted) terminals of the inverter circuits 11 and 12 are connected to, respectively. The burn-in device, disposed at the left margin of the circuit 100, includes a resistor 41 for short-circuiting the terminals 30A, 30B.

The test circuit 20 of the present embodiment is again similar to the above-described first and second embodiments. When a test mode signal BT, output from a test signal output terminal, not shown, of the test device, is entered at a preset logical level '1'to the test circuit 20, signals opposite in the logical levels are entered to the set (pari) of the inverter circuits which are in a short-circuited state by the resistor 41 provided in the burn-in device. For example if, during testing, a HIGH signal S1 is entered to the inverter circuit 11, a LOW signal, which is an inversion of the signal S1, is entered to the inverter circuit 12 and, if a LOW signal S1 is entered to the inverter circuit 11, a HIGH signal, which is an inversion of the signal S1, is entered to the inverter circuit 12, thus allowing for execution of an acceleration test.

According to the present embodiment, it is sufficient to provide a resistor 41, in place of a conventional pull-up or pull-down resistor, on the burn-in device side, so that the number of resistors used may be halved. Moreover, with the present embodiment, the resistance value of the resistor 41 on the burn-in device side may be changed with ease by suitable means, such as to limit the current value, depending on design parameters of the semiconductor integrated circuit under test.

Although the description of the preferred embodiments of the present invention has been made in the foregoing, the technical scope of the present invention is not restricted to the embodiments described, as may be seen from the operating principle of the invention. That is, a variety of modifications or substitutions of the present invention may be made without departing from the purport of the invention which resides in short-circuiting the output ends of two or more inverter circuits, supplying signals opposite in the signal levels to the input ends of the inverter circuits and setting current paths between transistors included in the inverter circuits to cause current to flow on the current paths so set. Although the resistors are provided on the current paths, in the above-described embodiments, it is also possible to interconnect the respective terminals by a current path including a constant current source or a variety of circuits provided with resistors.

In the above-described embodiments, the case of employing a CMOS inverter circuit has been described. The present invention may also be applied to activating the inverter circuits (NOT circuits) employing bipolar transistors, or to activating a variety of output buffers, employing the above circuits, such as output buffers implemented by Bi-CMOS circuits.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor integrated circuit including a plurality of inverter circuits connected to a plurality of output terminals, respectively, wherein preset ones of said output terminals, forming a set of output terminals, are so structured as to be able to be short-circuited;

said semiconductor integrated circuit comprising a test circuit that supplies signals of mutually exclusive logical values to a set of said inverter circuits, when output sides of said inverter circuits are in a short-circuited state.

2. The semiconductor integrated circuit according to claim 1 wherein output terminals of said inverter circuits may be short-circuited to one another via a resistor.

3. The semiconductor integrated circuit according to claim 1 wherein there are provided three or more of said inverter circuits, one of said output terminals forming a pair with each of the remaining two or more output terminals and being capable of being short-circuited with the output terminals paired thereto; said test circuit supplying signals of mutually exclusive logical values to said inverter circuits connected to the paired output terminals in the short-circuited state.

4. The semiconductor integrated circuit according to claim 1 wherein said test circuit includes a complementing circuit that inverts the logical value of an input signal to one inverter circuit and a selection circuit that supplies supplying an output signal of said complementing circuit to the other inverter circuit paired to said one inverter circuit.

5. The semiconductor integrated circuit according to claim 1 wherein said inverter circuit is a CMOS inverter and forms an output buffer.

6. A test device for a semiconductor integrated circuit comprising a plurality of output terminals connected to a plurality of inverter circuits, respectively, and a test circuit that supplies input signals of mutually exclusive logical values to preset ones of said inverter circuits, said test device further comprising:

a short-circuiting circuit that short-circuits preset ones of said output terminals connected to preset ones of said inverter circuits; and a test signal output terminal supplying a test signal to said test circuit for causing said test circuit to supply signals of mutually exclusive logical values to said inverter circuits when output sides of said inverter circuits are in a short-circuited state.

7. The test device for a semiconductor integrated circuit according to claim 6 wherein said short-circuiting circuit interconnects said output terminals via a resistor.

8. The test device for a semiconductor integrated circuit according to claim 6 wherein there are provided three or more of said inverter circuits, and one of said output terminals forming a pair with each of the remaining two or more output terminals is capable of being short-circuited with the output terminals paired thereto;

said test circuit supplies signals of mutually exclusive logical values to said inverter circuits, the output sides of which are in a short-circuited state, so that the inverter circuits of said semiconductor integrated circuit having three or more output terminals are driven simultaneously.

9. A test method for a semiconductor integrated circuit comprising:

providing a semiconductor integrated circuit including a plurality of output terminals connected to a plurality of inverter circuits, respectively, and a test circuit that supplies input signals of mutually exclusive logical values to preset ones of said inverter circuits, said test method further comprising:

a step of short-circuiting preset ones of output terminals connected to preset ones of said inverter circuits, respectively; and a step of supplying a test signal to said test circuit for causing said test circuit to supply signals of mutually exclusive logical values to said inverter circuits where output sides are in a short-circuited state;

the logical values of input signals to said preset inverter circuits, where output sides are in a short-circuited state, are periodically interchanged to alternately drive said preset inverter circuits.

* * * * *